United States Patent
Khan et al.

(10) Patent No.: US 12,306,248 B2
(45) Date of Patent: May 20, 2025

(54) SCAN CHAINS WITH MULTI-BIT CELLS AND METHODS FOR TESTING THE SAME

(71) Applicant: Taiwan Semiconductor Manufacturing Company, Ltd., Hsinchu (TW)

(72) Inventors: Mohammed Moiz Khan, San Jose, CA (US); Sandeep Kumar Goel, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 55 days.

(21) Appl. No.: 18/350,509

(22) Filed: Jul. 11, 2023

(65) Prior Publication Data

US 2025/0020719 A1 Jan. 16, 2025

(51) Int. Cl.
*G01R 31/3185* (2006.01)
*G01R 31/3177* (2006.01)

(52) U.S. Cl.
CPC . *G01R 31/318536* (2013.01); *G01R 31/3177* (2013.01); *G01R 31/318544* (2013.01)

(58) Field of Classification Search
CPC ........ G01R 31/318536; G01R 31/3177; G01R 31/318544
See application file for complete search history.

(56) References Cited

U.S. PATENT DOCUMENTS

| | | | |
|---|---|---|---|
| 6,668,347 B1 * | 12/2003 | Babella .......... | G01R 31/318536 714/733 |
| 11,249,134 B1 * | 2/2022 | Jain .................... | G01R 31/3177 |
| 2006/0164119 A1 * | 7/2006 | Nowak-Leijten ........................... | H03K 19/17728 326/41 |
| 2011/0258498 A1 * | 10/2011 | Chandra ........ | G01R 31/318536 714/E11.155 |
| 2013/0173976 A1 * | 7/2013 | Tekumalla ..... | G01R 31/318536 714/E11.155 |
| 2013/0185608 A1 * | 7/2013 | Bhawmik ...... | G01R 31/318558 714/E11.155 |
| 2015/0128001 A1 * | 5/2015 | Raina ..................... | G11C 29/12 714/726 |
| 2016/0349318 A1 * | 12/2016 | Pereira ........... | G01R 31/318552 |
| 2017/0292993 A1 * | 10/2017 | Yoon .................. | G01R 31/3177 |
| 2021/0281250 A1 * | 9/2021 | Hsu .................. | H03K 3/356121 |

* cited by examiner

*Primary Examiner* — Guy J Lamarre
(74) *Attorney, Agent, or Firm* — FOLEY & LARDNER LLP

(57) ABSTRACT

A circuit includes a scan chain comprising a cell structure, wherein the cell structure comprises a first plural number (N) of stages, and each of the stages is configured to store a bit. The circuit includes a second plural number (S) of multiplexers operatively coupled to the scan chain, wherein the S is determined as $$\frac{N}{M},$$

where the M represents a diagnostic resolution. The multiplexers are each configured to receive a respective one of S control signals to selectively bypass a corresponding subset of the stages.

20 Claims, 11 Drawing Sheets

| Cell Position | Cell | A | B₁ | B₂ | B₃ | B₄ | SB₄ | SB₃ | SB₂ | SB₁ | SA |
|---|---|---|---|---|---|---|---|---|---|---|---|
| | Pattern | | B₁ | B₂ | B₃ | B₄ | B₄ | B₃ | B₂ | B₁ | A |
| Mode_cntl=0 | Shadow | | | | | | | | | | |
| | Load/Unload | 0 | 0 | 0 | 0 | 0 | 0 | 0 | 0 | 0 | 0 |
| | Load w/ Defect | 0 | 1 | 1 | 1 | 1 | 1 | 1 | 1 | 1 | 1 |
| | Unload w/ Defect | 1 | 1 | 1 | 1 | 1 | 1 | 1 | 1 | 1 | 1 |
| Mode_cntl=1 | Load Cycle 0 | 0 | 1 | 1 | 1 | X | X | X | X | 1 | X |
| | Load Cycle 1 | 0 | 1 | 1 | X | X | X | X | 1 | 1 | 0 |
| | Load Cycle 2 | 0 | 1 | 1 | 1 | X | X | 1 | 1 | 1 | 0 |
| | Load Cycle 3 | 0 | 1 | 1 | 1 | 1 | 1 | 1 | 1 | 1 | 0 |
| | Load Cycle 4 | 0 | 1 | 1 | 1 | 1 | 1 | 1 | 1 | 1 | 0 |
| Mode_cntl=0 | Unload w/ Defect | 1 | 1 | 1 | 1 | 1 | 1 | 1 | 1 | 1 | 0 |

FIG. 7

SCAN CHAINS WITH MULTI-BIT CELLS AND METHODS FOR TESTING THE SAME

BACKGROUND

Integrated circuits (ICs) routinely achieve densities of millions of gates per chip, which presents an especially difficult testing challenge. ICs are typically designed by combining pre-defined, standard functional blocks called core cells from a variety of sources with discrete logic to perform a desired function or group of functions. Although standard test vectors or test strategies may be supplied with the core cells, their internal connections to one another inside the IC are frequently inaccessible from the pins of the IC, rendering the standard tests unusable and complicating the testing procedure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a schematic table illustrating various operation statuses of the scan chain of FIG. 6, in accordance with some embodiments.

DETAILED DESCRIPTION

Figure 1:
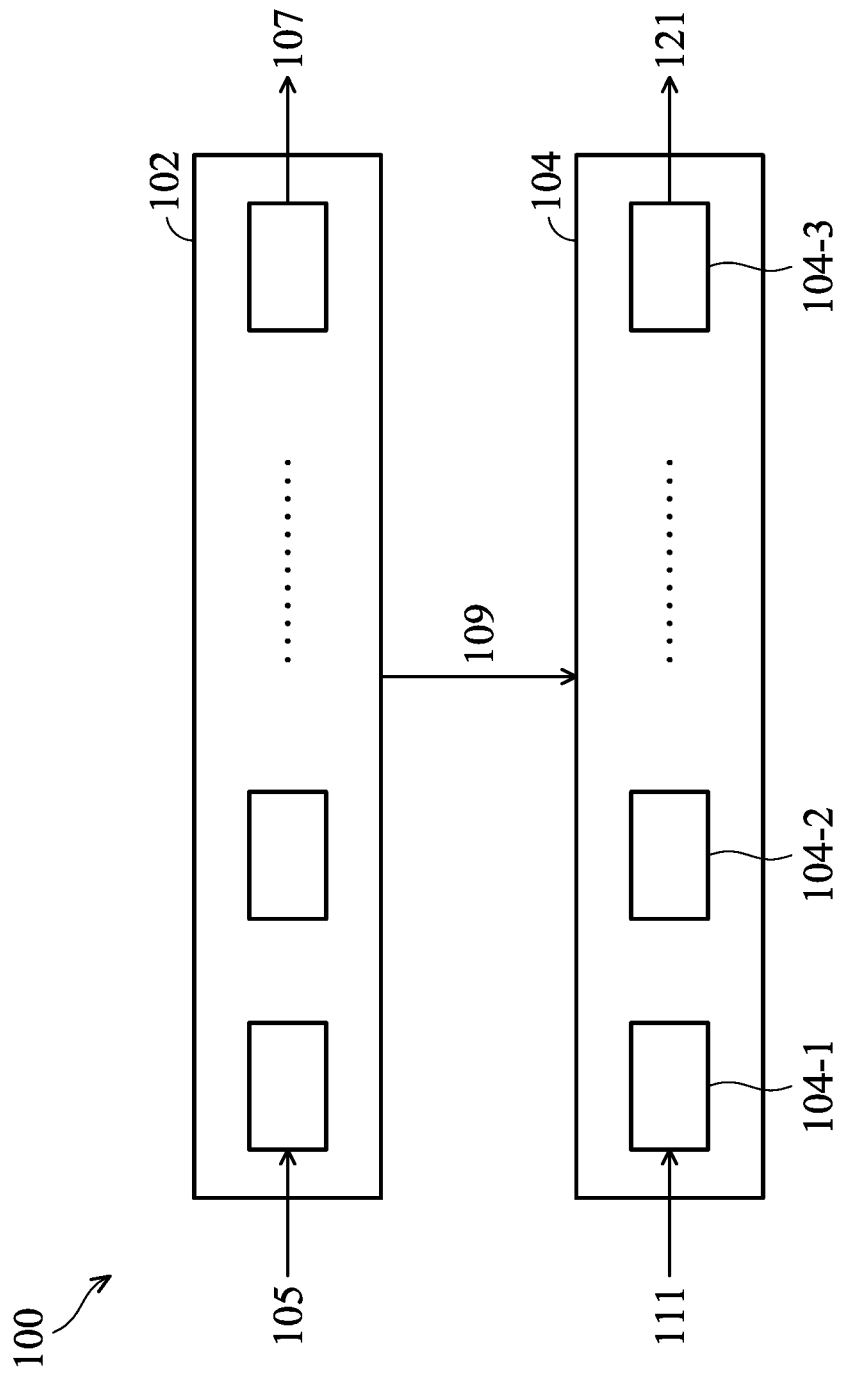
FIG. 1 illustrates a block diagram of an example integrated circuit including a to-be tested circuit and a scan chain, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with the Moore's Law, the number of transistors on an integrated circuit doubles every two years. Although such a high packing density allows more functions to be incorporated per unit area of an integrated circuit, it is becoming increasingly difficult for foundries to manufacture a defect free integrated circuit as packing densities continue to increase. This predicament has exalted the significance of Design-for-Testability (DFT) in an integrated circuit design. Scan chains, one of various DFT techniques, can be used for testing some or all parts of an integrated circuit. A scan chain typically includes a plurality of flip-flops that are shifted to set the integrated circuit in a given state and determine if each part of the integrated circuit operates correctly. However, scan chains are only effective if the scan chains themselves are operable and do not include defects. A defect in a scan chain can prevent proper testing of the integrated circuit as it may prevent a circuit from being set in a given state.

Recently, a multi-bit flip-flop (MBFF) technique has been introduced as a method for reducing the power consumption and chip area of integrated circuits during the physical implementation stage of their development process. This technique merges a plural number of single-bit flip-flops into a single multi-bit flip-flop, sometimes referred to as a multi-bit cell structure or a multi-bit cell. Scan chains including multi-bit cells can be tested by an existing bidirectional scan technique which generally treating each of the multi-bit cells as a single unit. In this way, a diagnostic resolution would disadvantageously suffer because the existing bidirectional scan technique is required to report all bits of a multi-bit cell as suspects if the multi-bit cell is a suspect. Stated another way, the diagnostic resolution is inherently limited (e.g., with a lower bound) by the number of bits of a multi-bit cell. Thus, the existing scan techniques have not been entirely satisfactory in some aspects.

The present disclosure provides various embodiments of a scan chain with one or more multi-bit cells and method for testing the same. In various embodiments, the scan chain, as disclosed herein, includes at least one multi-bit cell, which may be implemented as any of various multi-bit flip-flops. The multi-bit cell typically consists of more than one flip-flop. In addition to clock (CLK), scan in (SI) and scan enable (SE) pins, the multi-bit cell may have a plural number of input (D) pins and the same number of output (Q) pins. The multi-bit cell has a plural number (N) of cell stages, each of which can store a (data) bit. Further, the disclosed scan chain includes plural(S) multiplexers with a number that can be flexibly adjusted according to a diagnostic resolution (M). For example, the parameter S' can be determined as N/M. In various embodiments, the parameter M can be any of the factors of the parameter N. Each of the multiplexers can be controlled by a respective control signal to bypass a corresponding subset (number) of the cell stages that is equal to the diagnostic resolution (M).

In this configuration, a defect in any of the cell stages can be accurately detected or otherwise determined by controlling the multiplexers through a plural number (P) of chain test patterns, each of the chain test patterns represents a respective combination of the control signals. Accordingly, each chain test pattern can be configured to bypass a corresponding subset (number) of the cell stages that can be an integer multiple of the parameter M. In some embodiments, the parameter P is equal to S+1. As such, the defect location can be pinpointed down to the flexible diagnostic resolution (e.g., a certain cell stage) based on first identifying a passed data pattern (unloaded by the scan chain based on a corresponding one of the P chain test patterns) after observing one or more failed data patterns (unloaded by the scan chain based on one or more corresponding ones of the P chain test patterns). Consequently, even having a defective stage or bit, the multi-bit cell will not be ruled out as a defective cell as a whole. Instead, the defective stage of a multi-bit cell on the disclosed scan chain can be accurately identified. Further, the diagnostic resolution for the scan chain can be flexibly adjusted and will not be limited by a (stage) size of the included multi-bit cell(s).

FIG. 1 illustrates a block diagram of an example circuit 100, in accordance with various embodiments. The circuit 100 includes a to-be tested circuit 102 and a scan chain testing circuit (sometimes referred to as a scan chain) 104. Although the illustrated embodiment of FIG. 1 shows that the to-be tested circuit 102 and the scan chain 104 are two different and separate blocks, in some embodiments, the to-be tested circuit 102 and the scan chain testing circuit 104 may be integrated together.

In various embodiments, the to-be tested circuit 102 includes a combinational logic circuit including a plurality of logic gates interconnected with each other, and the scan chain 104 includes one or more scan flip-flop circuits, e.g., 104-1, 104-2, 104-3, etc., coupled with each other as a chain. According to some embodiments of the present disclosure, at least one of the flip-flop circuits of the scan chain 104 is a multi-bit flip-flop that is configured to store multiple bits. Such a multi-bit flip-flop is sometimes referred to as a multi-bit (MB) cell, while a flip-flop that is configured to store a single bit is sometimes referred to as a single-bit (SB) cell, in the following discussion.

More specifically in FIG. 1, each scan flip-flop circuit (104-1, 104-2, 104-3, etc.) is coupled to a respective subset of logic gates of the to-be tested circuit 102. The scan chain 104 is configured to switch between at least two modes: a normal operation mode and a scan test mode. When the scan chain 104 operates under the normal operation mode, the scan chain 104 receives a data signal 109 while the to-be tested circuit 102 normally generates its output signal 107 in response to input signal 105. When the scan chain 104 operates under the scan test mode, the scan chain 104 receives a scan-in (SI) signal 111 and generates a scan-out (SO) signal 121. In generally, a defect on one or more scan flip-flop circuits (i.e., one or more malfunctioning flip-flop circuits) of the scan chain 104 may be detected by comparing one or more differences between the SI signal 111 and SO signal 121. And such a flip-flop circuit may be used to pinpoint which corresponding subset of logic gates are malfunctioning. Further, a more accurate location of the defect, if presented by the at least one of the scan flip-flop circuits that is MB cell, can also be detected based on the present disclosure. Details will be described as follows.

Figure 2:
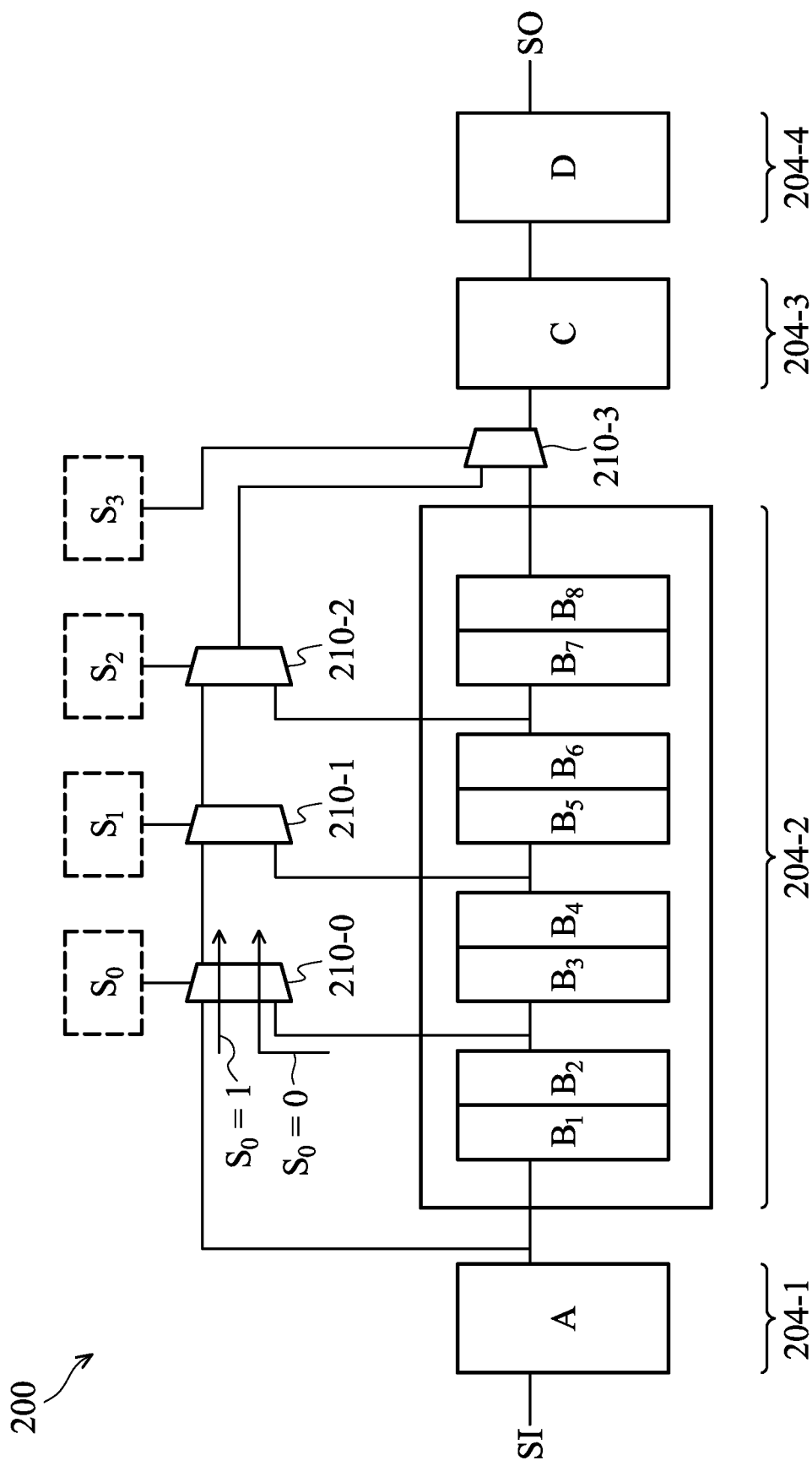
FIG. 2 illustrates a schematic diagram of an example scan chain, in accordance with some embodiments.

FIG. 2 illustrates a schematic diagram of an example scan chain 200, in accordance with various embodiments. The scan chain 200 can be an implementation of the scan chain 104 shown in FIG. 1. For example, the scan chain 200 can be operatively coupled to a to-be tested circuit, which is not shown in FIG. 2 for brevity purposes. In various embodiments of the present disclosure, the scan chain 200 includes at least one MB cell that includes a plural number of stages to store a plural number of data bits.

As shown, the scan chain 200 includes scan flip-flop circuits, 204-1, 204-2, 204-3, and 204-4 connected in series fashion. The scan chain 200 itself can be tested under a scan test mode in which a scan-in (SI) signal, received by the scan chain 200, is compared to a scan-out (SO) signal, generated by the scan chain 200. Such SI signal and SO signal are sometimes referred to as loaded data pattern and unloaded data pattern, respectively. In the illustrated example of FIG. 2, the scan flip-flop circuits 204-1, 204-3, and 204-4 are each a SB cell, while the scan flip-flop circuit 204-2 is a MB cell. Further in the example of FIG. 2, the multi-bit flip-flop circuit 204-2 includes multiple (cell) stages, that are indicated as "$B_1$," "$B_2$," "$B_3$," "$B_4$," "$B_5$," "$B_6$," "$B_7$," and "$B_8$," respectively. Each of the stages is configured to store one single data bit. For consistency, the single-bit flip-flop circuits 204-1, 204-3, and 204-4 are indicated as stages "A," "C," and "D," respectively.

In various embodiments, the scan chain 200 can further include a number (S) of multiplexers operatively coupled to the multi-bit flip-flop circuit 204-2. Each of the multiplexers corresponds to a respective subset of stages included in the multi-bit flip-flop circuit 204-2. Specifically, each of the multiplexers can selectively bypass the corresponding subset of stages, when the scan chain 200 operates under the scan test mode. The parameter S' is determined based on a number (N) of the stages included in the multi-bit flip-flop circuit 204-2 and a diagnostic resolution (M). The diagnostic resolution (M) can be flexibly adjusted according to various operation parameters of the scan chain 200 (or the operatively coupled to-be tested circuit) such as, for example, power consumption, performance orientation, etc. The parameter S may be determined as $$\frac{N}{M},$$

according to various embodiments of the present disclosure.

In the illustrated embodiment of FIG. 2, the multi-bit flip-flop circuit 204-2 has 8 stages (N=8). When the diagnostic resolution (M) is configured as 2, the scan chain 200 can thus include 4 (S=8/2) multiplexers coupled to the multi-bit flip-flop circuit 204-2, e.g., 210-0, 210-1, 210-2, and 210-3. Each of the multiplexer 210-0 to 210-3 can correspond to (e.g., bypass) a respective subset of stages. For example, the multiplexer 210-0 can correspond to (e.g., bypass) the stages $B_1$ and $B_2$; the multiplexer 210-1 can correspond to (e.g., bypass) the stages $B_3$ and $B_4$; the multiplexer 210-2 can correspond to (e.g., bypass) the stages $B_5$ and $B_6$; and the multiplexer 210-3 can correspond to (e.g., bypass) the stages $B_7$ and $B_8$.

Further, each of the multiplexer 210-0 to 210-3 has two inputs and one output, and each of the multiplexer 210-0 to 210-3 is controlled by a respective control signal to selectively output one of the received input signals. For example, the multiplexer 210-0 has a first input configured to receive a first signal output from stage A, a second input configured to receive a second signal output from the stage $B_2$, and an output that is configured to selectively output one of the first or second signal based on a control signal $S_0$. In one aspect of the present disclosure, when the control signal $S_0$ is provided at logic 1, the multiplexer 210-0 outputs the first signal; and when the control signal $S_0$ is provided at logic 0, the multiplexer 210-0 outputs the second signal, as illustrated in FIG. 2. Stated another way, the multiplexer 210-0 is configured to bypass the corresponding states $B_1$ and $B_2$, in response to the corresponding control signal $S_0$ is pulled high. Similarly, the multiplexer 210-1 is configured to bypass the corresponding states $B_3$ and $B_4$, in response to the corresponding control signal $S_1$ is pulled high; the multiplexer 210-2 is configured to bypass the corresponding states $B_5$ and $B_6$, in response to the corresponding control signal $S_2$ is pulled high; and the multiplexer 210-3 is configured to bypass the corresponding states $B_7$ and $B_8$, in response to the corresponding control signal $S_3$ is pulled high.

In various embodiments of the present disclosure, a number (P) of combinations and arrangements of the control signal $S_0$ to $S_3$, which may sometimes be referred to as chain test patterns, is determined as S+1. Further, the chain test patterns may be incrementally changed from one another in a certain order, and the chain test patterns may be sequentially applied to the multiplexers 210-0 to 210-3 following the same order. For example, a first one of the chain test patterns ($P_0$) that has four bits for the control signals $S_0$, $S_1$, $S_2$, $S_3$, respectively, may be provided as "0000;" a second one of the chain test patterns ($P_1$) that has four bits for the control signals $S_0$, $S_1$, $S_2$, $S_3$, respectively, may be provided as "0001;" a third one of the chain test patterns ($P_2$) that has four bits for the control signals $S_0$, $S_1$, $S_2$, $S_3$, respectively, may be provided as "0011;" a fourth one of the chain test patterns ($P_3$) that has four bits for the control signals $S_0$, $S_1$, $S_2$, $S_3$, respectively, may be provided as "0111;" and a fifth one of the chain test patterns ($P_4$) that has four bits for the control signals $S_0$, $S_1$, $S_2$, $S_3$, respectively, may be provided as "1111."

As indicated, the second chain test patterns $P_1$ is incrementally changed from the first chain test patterns $P_0$ with one bit; the third chain test patterns $P_2$ is incrementally changed from the second chain test patterns $P_1$ with one bit; the fourth chain test patterns $P_3$ is incrementally changed from the third chain test patterns $P_2$ with one bit; and the fifth chain test patterns $P_4$ is incrementally changed from the fourth chain test patterns $P_3$ with one bit. Following this order of incrementation, the chain test patterns $P_0$ to $P_4$ are sequentially applied to the multiplexers 210-0 to 210-3.

Figure 3:
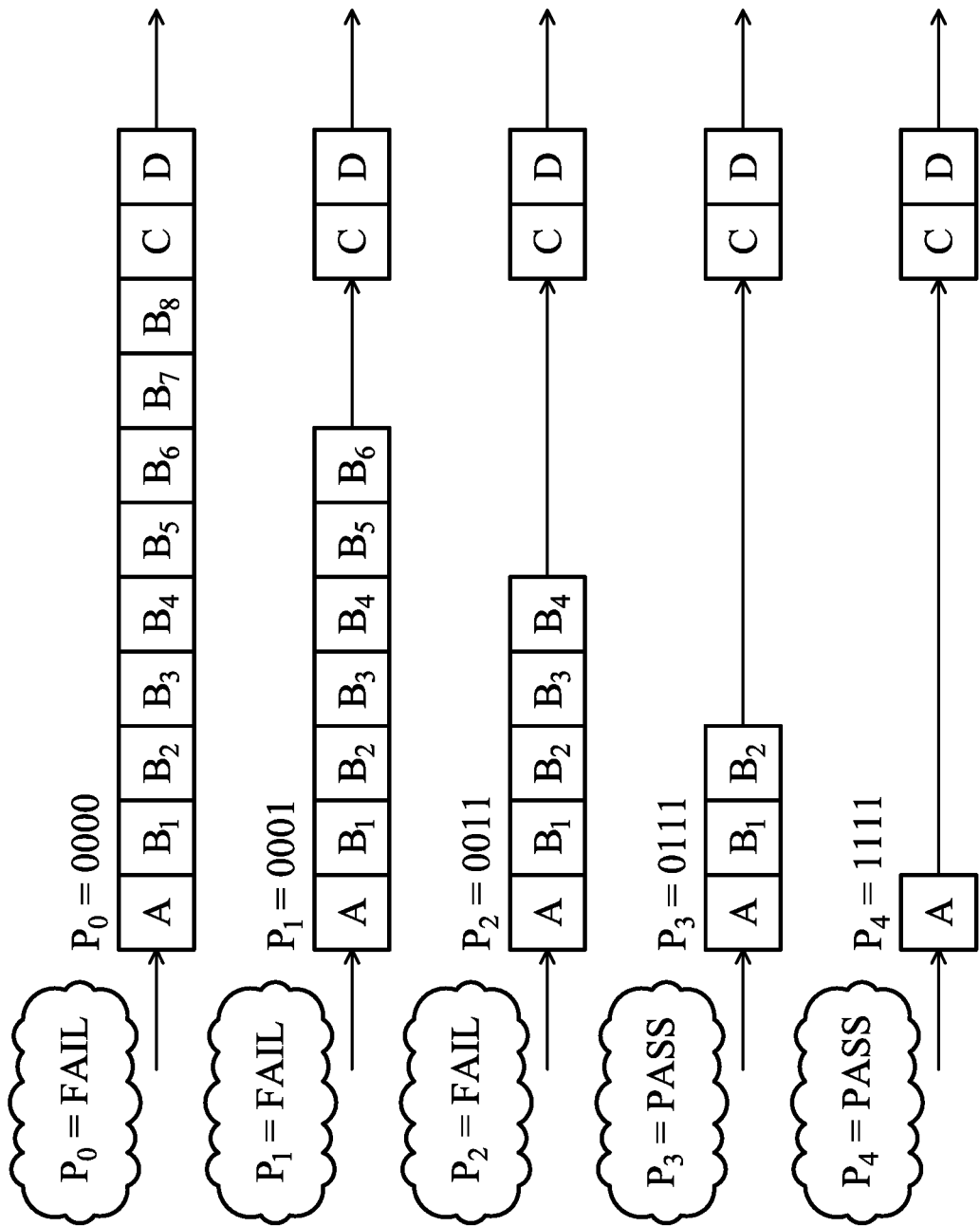
FIG. 3 is a schematic diagram illustrating various operation statuses of the scan chain of FIG. 2, in accordance with some embodiments.

FIG. 3 illustrates a schematic diagram illustrating the respective statuses of the scan chain 200 when the chain test patterns $P_0$ to $P_4$ are sequentially applied to the multiplexers 210-0 to 210-3 (that are coupled to the multi-bit flip-flop circuit 204-2), in accordance with various embodiments. As shown, when the chain test patterns $P_0$ (0000) is applied to the multiplexers 210-0 to 210-3, no stage inside the multi-bit flip-flop circuit 204-2 is bypassed, and thus, all stages $AB_1B_2B_3B_4B_5B_6B_7B_8CD$ are observable (e.g., shifting data bits). Next, when the chain test patterns $P_1$ (0001) is applied to the multiplexers 210-0 to 210-3, the stages $B_7$ and $B_8$ inside the multi-bit flip-flop circuit 204-2 are bypassed, and thus, only stages $AB_1B_2B_3B_4B_5B_6CD$ are observable (e.g., shifting data bits). Next, when the chain test patterns $P_2$ (0011) is applied to the multiplexers 210-0 to 210-3, the stages $B_5$, $B_6$, $B_7$, and $B_8$ inside the multi-bit flip-flop circuit 204-2 are bypassed, and thus, only stages $AB_1B_2B_3B_4CD$ are observable (e.g., shifting data bits). Next, when the chain test patterns $P_3$ (01111) is applied to the multiplexers 210-0 to 210-3, the stages $B_3$, $B_4$, $B_5$, $B_6$, $B_7$, and $B_8$ inside the multi-bit flip-flop circuit 204-2 are bypassed, and thus, only stages $AB_1B_2CD$ are observable (e.g., shifting data bits). Next, when the chain test patterns $P_4$ (11111) is applied to the multiplexers 210-0 to 210-3, the stages $B_1$, $B_2$, $B_3$, $B_4$, $B_5$, $B_6$, $B_7$, and $B_8$ inside the multi-bit flip-flop circuit 204-2 are bypassed, and thus, only stages ACD are observable (e.g., shifting data bits).

Figure 4:
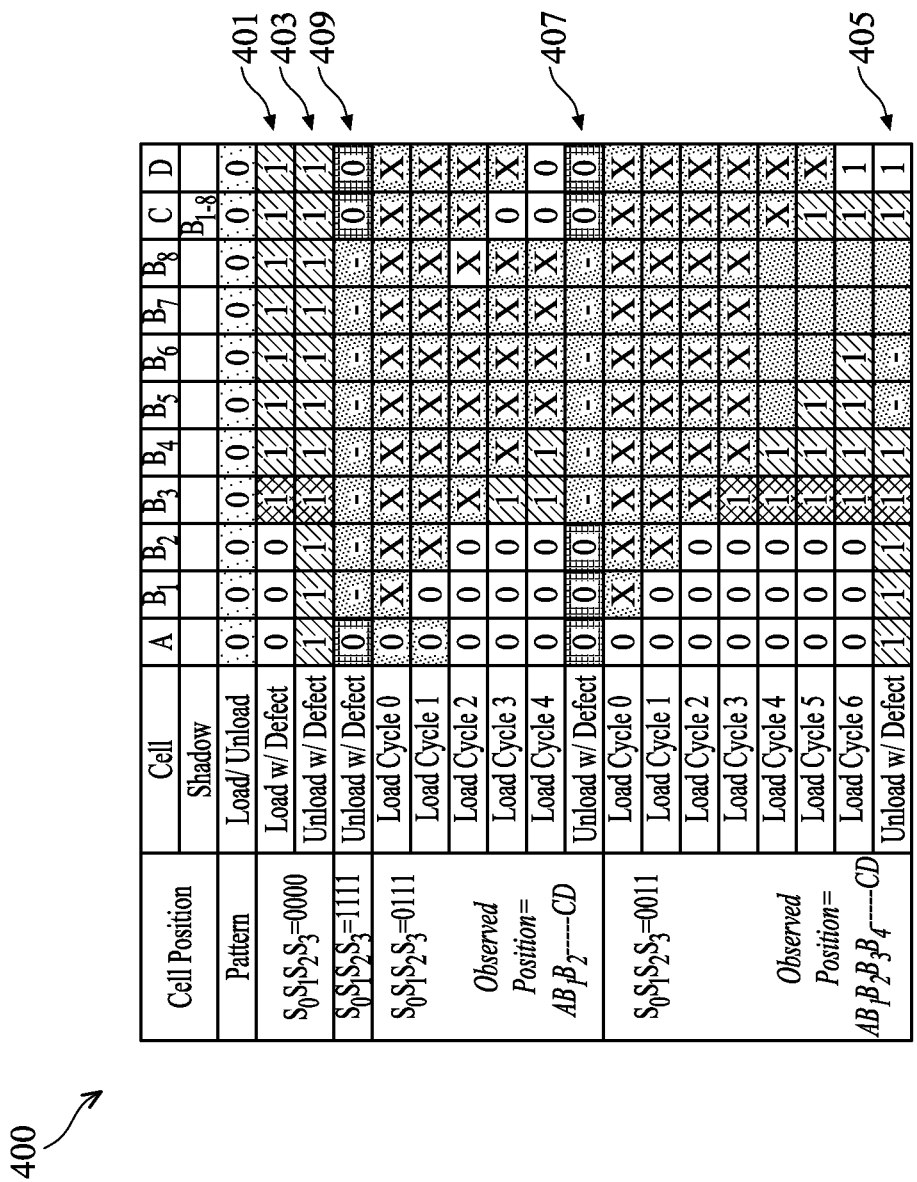
FIG. 4 is a schematic table illustrating various operation statuses of the scan chain of FIG. 2, in accordance with some embodiments.

In various embodiments, a defect in any of the subsets of stages, or any of the grouped stages, (e.g., $B_1B_2$, $B_3B_4$, $B_5B_6$, $B_7B_8$) can be pinpointed by sequentially applying the chain test patterns $P_0$ to $P_4$ to the multiplexers 210-0 to 210-3. Referring to FIG. 4 while still in conjunction with FIG. 3, depicted is an example table 400 with multiple rows to illustrate data patterns loaded into (an SI signal) or unloaded from (an SO signal) the scan chain 200. In the example of FIG. 4, the stage $B_3$ has a stuck-at-1 defect. The term "stuck-at-1" refers to a defect present in a flip-flop or cell stage, in which the cell stage can only output a logic 1, regardless of the input logic state received. The table of FIG. 4 is merely provided as a representative example. Thus, it should be noted that the disclosed methods and structures allow any of various other defects (e.g., stuck-at-0, transition defects, etc.) to be detected on a scan chain, while remaining within the scope of the present disclosure.

As shown in FIG. 4, the SI signal (00000000000) is loaded to the scan chain 200. Assuming there were no defect in any of the stages $AB_1B_2B_3B_4B_5B_6B_7B_8CD$, the SO signal unloaded by the scan chain 200 should also present (00000000000). However, since the stage $B_3$ has a stuck-at-1 defect, this may not be the case. For example in row 401, the chain test pattern $P_0$ (0000) is first applied to the multiplexers 210-0 to 210-3, with the SI signal still being (00000000000). As the stage $B_3$ has a stuck-at-1 defect, every stage after the stage $B_3$ shows a logic 1. Consequently, in row 403, the SO signal unloaded from the scan chain shows (11111111111), which means that, with no stage being bypassed, the scan chain 200 fails the scan test (as shown in FIG. 3). Next, the chain test pattern $P_1$ (0001) is applied to the multiplexers 210-0 to 210-3, with the SI signal still being (00000000000). Similarly, the SO signal is not (00000000000) (0000000--00), which means that even with the stages $B_7$ and $B_8$ being bypassed, the scan chain 200 still fails the scan test (as shown in FIG. 3). Next, the chain test pattern $P_2$ (0011) is applied to the multiplexers 210-0 to 210-3, with the SI signal still being (00000000000). Similarly, the SO signal is still not (00000----00), as shown in row 405, which means that even with the stages $B_5$ to $B_8$ being bypassed, the scan chain 200 still fails the scan test (as shown in FIG. 3).

Next, the chain test pattern $P_3$ (0111) is applied to the multiplexers 210-0 to 210-3, with the SI signal still being (00000000000). Different from the previous chain test patterns applied, the SO signal is now (00-00) (000------00), as shown in row 407, which means that with the stages $B_3$ to $B_8$ being bypassed, the scan chain 200 passes the scan test (as shown in FIG. 3). In various embodiments, a location of the defect can be determined once a chain test pattern has firstly produced a passed SO signal. Specifically, the location of the defect can be determined as being present at the grouped stage that is bypassed by such a chain test pattern. In the above example, the chain test patterns $P_0$ to $P_2$ have not produced any passed SO signal until $P_3$ is applied, and thus, the defect can be determined as being present in any of the stage $B_3$ or $B_4$ that is bypassed by the chain test patterns $P_3$. In some embodiments, the chain test pattern $P_4$ (1111) may still be applied to the multiplexers 210-0 to 210-3, with the SI signal still being (00000000000), even identifying the defect. As shown in row 409, the SO signal is now (0------00), since the defective stage $B_3$ or $B_4$ has been bypassed and no defect is present in the stage $B_1$ or $B_2$ (which is also bypassed).

Figure 5:
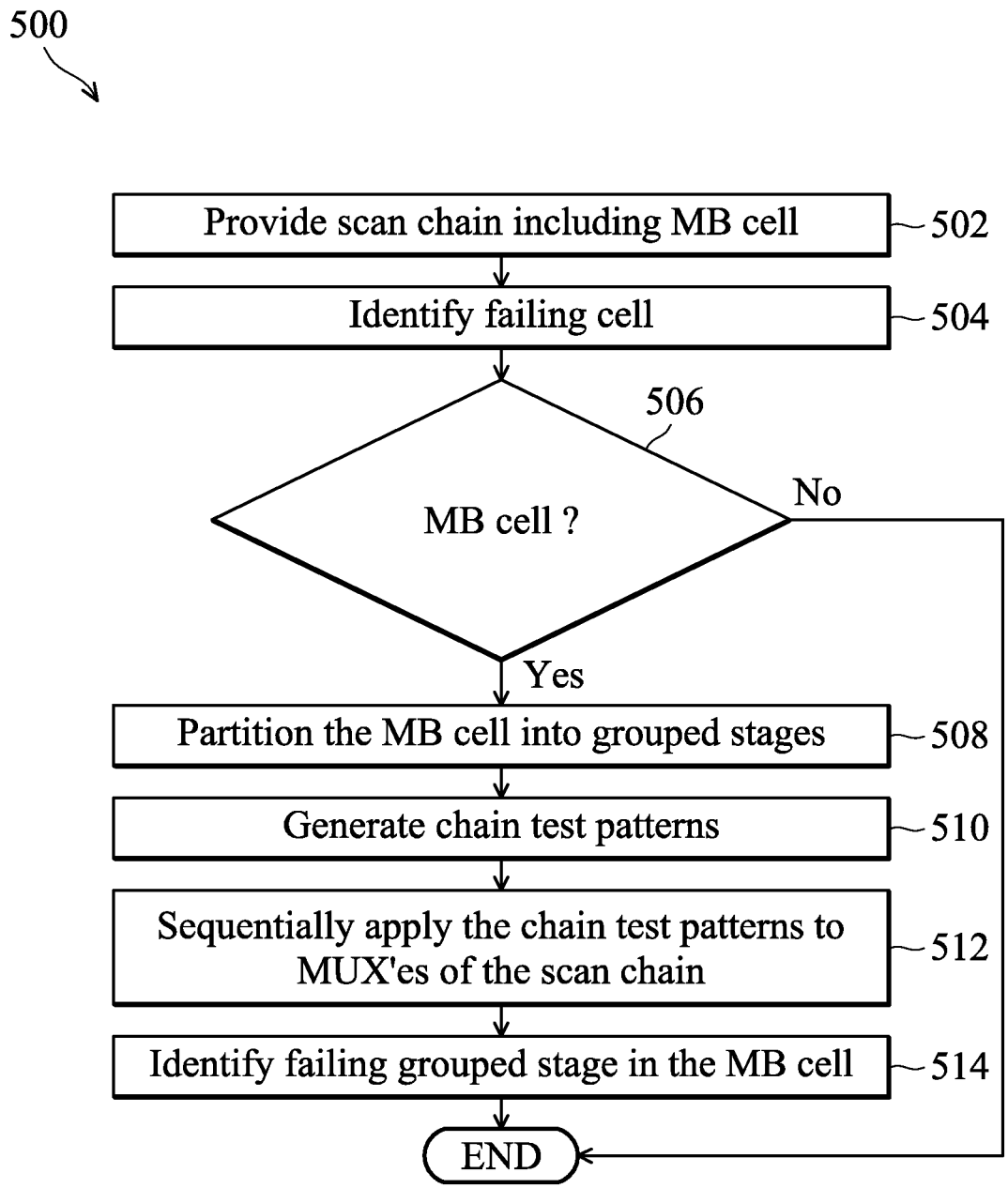
FIG. 5 illustrates a flow chart of an example method for testing the scan chain of FIG. 2, in accordance with some embodiments.

FIG. 5 illustrates a flow chart of an example method 500 for testing a scan chain that includes at least one MB cell, in accordance with various embodiments. The method 500 may be utilized to test the scan chain 200 of FIG. 2, and thus, discussion of the operations of the method 500 may be referred to one or more components discussed above in FIGS. 2-4. It is noted that the method 500 is merely an example and is not intended to limit the present disclosure. Accordingly, it is understood that additional operations may be provided before, during, and after the method 500 of FIG. 5, and that some other operations may only be briefly described herein.

The method 500 starts with operation 502 in which a scan chain including at least one MB cell is provided, in accordance with some embodiments of the present disclosure. Using the scan chain 200 as a representative example, the scan chain 200 includes a plurality of flip-flop circuits, 204-1, 204-2, 204-3, and 204-4, connected in series, in which the flip-flop circuit 204-1, 204-3, and 204-4 are each a SB cell (a single-bit flip-flop) that includes a single stage, and the flip-flop circuit 204-2 is a MB cell (a multi-bit flip-flop) that includes a plural number of stages.

The method 500 proceeds to operation 504 in which a failing cell in the scan chain provided is identified, in accordance with some embodiments of the present disclosure. Various chain diagnosis techniques known in the art can be applied to identify such a failing cell such as, for example, software-based techniques, bi-directional (reversible) scan chain techniques, etc. It should be noted that under this chain diagnosis operation, each flip-flop circuit is treated as a single unit, regardless of the number of bits it has. Alternatively stated, even if the flip-flop circuit 204-2 is a MB cell, the flip-flop circuit 204-2 is treated as a scan cell unit just like any of other flip-flop circuits 204-1, 204-3, or 204-4, in the above example.

The method 500 proceeds to operation 506 to determine whether the failing cell is a MB cell, in accordance with some embodiments of the present disclosure. If not (e.g., the failing cell is one of the SB cell 204-1, 204-3, or 204-4), the method 500 may proceed to end operation in which a defect on the scan chain has been identified and no more test is needed. However, if so (e.g., the failing cell is the MB cell 204-2), the method 500 may proceed to the following operations to identify which of the stages in the MB cell has the defect.

For example, the method 500 can proceed to operation 508 in which the failing MB cell is partitioned into a number of grouped stages, in accordance with some embodiments of the present disclosure. Continuing with the above example, the MB cell 204-2 has eight (N) single stages, $B_1$, $B_2$, $B_3$, $B_4$, $B_5$, $B_6$, $B_7$, and $B_8$, each of which can store a single data bit. Based on a diagnostic resolution (M), the MB cell 204-2 can be partitioned into a number (S) of grouped stages, e.g., $$S = \frac{N}{M} = 4.$$

Upon partitioning the MB cell 204-2 into four grouped stages, $B_1B_2$, $B_3B_4$, $B_5B_6$, and $B_7B_8$, a corresponding number of multiplexers, e.g., 210-0, 210-1, 210-2, and 210-3, can be added to the scan chain 200. Each of the multiplexers 210-0 to 210-3 can correspond to (e.g., bypass) a respective grouped stage. For example, the multiplexer 210-0 can bypass the grouped stage $B_1B_2$; the multiplexer 210-1 can bypass the grouped stage $B_3B_4$; the multiplexer 210-2 can bypass the grouped stage $B_5B_6$; and the multiplexer 210-3 can bypass the grouped stage $B_7B_8$.

Next, the method 500 can proceed to operation 510 in which a number of chain test patterns are generated to control the added multiplexers, in accordance with some embodiments of the present disclosure. The number (P) of chain test patterns is equal to the number of multiplexers (or the number of grouped stages) plus one, i.e., S+1. Further, each of the P chain test patterns has a number of bits corresponding to the number of multiplexers, i.e., S bits in each chain test pattern, according to some embodiments. An order of the bits of each chain test pattern can correspond to relative locations of the multiplexers. For example, the bits (of each chain test pattern) are arranged in an order mapping the locations of the multiplexers. Still further, the P chain test patterns may be assigned to incrementally change following the order, e.g., changing one bit for the next chain test pattern from the right to left.

In the above example, each of the P chain test patterns has four bits, the leftmost of which corresponds to the multiplexer 210-0, the next leftmost of which corresponds to the multiplexer 210-1, the next rightmost of which corresponds to the multiplexer 210-2, the rightmost of which corresponds to the multiplexer 210-3. A first (or initial) one of the P chain test patterns may be presented as (0000); a second one of the P chain test patterns may be presented as (0001), which changes the rightmost bit in the first chain test pattern from 0 to 1; a third of the P chain test patterns may be presented as (0011), which changes the second rightmost bit in the second chain test pattern from 0 to 1; a fourth one of the P chain test patterns may be presented as (0111), which changes the third rightmost bit in the third chain test pattern from 0 to 1; and a fifth one of the P chain test patterns may be presented as (1111), which changes the fourth rightmost bit in the fourth chain test pattern from 0 to 1. In some embodiments, a logic 0 of the chain test pattern may be indicative for the corresponding multiplexer not to bypass the corresponding grouped stage, and a logic 1 of the chain test pattern may be indicative for the corresponding multiplexer to bypass the corresponding grouped stage.

In some embodiments, the order of the operations 502 to 510 may be changed. For example, subsequent to operation 502 and prior to operation 504, operations 508 and 510 may be performed. As such, the method 500 may have operations 502, 508, 510, 504, 506, 512, and 514 performed in such an order. In another example, subsequent to operation 502 and prior to operation 504, operation 508 may be performed. As such, the method 500 may have operations 502, 508, 504, 506, 510, 512, and 514 performed in such an order.

Next, the method 500 can proceed to operation 512 in which the chain test patterns are sequentially applied to the multiplexes of the scan chain, in accordance with some embodiments of the present disclosure. Still with the same example above, the first to fifth chain test patterns are sequentially applied to the multiplexers 210-0 to 210-3. For example, the first chain test pattern (0000) is first applied to all four multiplexers 210-0 to 210-3 during load cycles of an SI signal to the scan chain 200. When the first chain test pattern is applied, no stage on the scan chain 200 is bypassed. Thus, the scan chain 200 has a total of 11 stages ($AB_1B_2B_3B_4B_5B_6B_7B_8CD$), there may be a total of 11 load cycles. Following the load cycles, data stored by the stages of the scan chain is unloaded as an SO signal. Based on the unloaded SO signal, it can be determined whether the scan chain 200 passes the scan test. In the current case, the scan chain 200 fails the test. Next, the second chain test pattern (0001) is applied to all four multiplexers 210-0 to 210-3. When the second chain test pattern is applied, states stages $B_7$ and $B_8$ are bypassed. Thus, the scan chain 200 has a total of 9 stages ($AB_1B_2B_3B_4B_5B_6\_CD$), there may be a total of 9 load cycles. Similarly, following the load cycles, the SO signal is examined with respect to the SI signal to determine whether the scan chain 200 passes the test. In the current example, the scan chain 200 still fails the test.

Following the same principle, the rest of the chain test patterns (the third, fourth, and fifth chain test patterns) are sequentially applied to all four multiplexers 210-0 to 210-3, and during the time period when each of the chain test patterns is applied, a corresponding number of load cycles are performed to generate a respective SO signal. For example, when the third chain test pattern (0011) is applied, a total of 7 load cycles are performed; when the fourth chain test pattern (0111) is applied, a total of 5 load cycles are performed; and when the fifth chain test pattern (1111) is applied, a total of 3 load cycles are performed.

Next, the method 500 can proceed to operation 514 in which a failing grouped stage of the MB cell is identified, in accordance with some embodiments of the present disclosure. In various embodiments of the present disclosure, the failing grouped stage can be identified based on comparing a first unloaded data pattern and a second unloaded data pattern generated by a first chain test pattern and a second chain test pattern, respectively. The second chain test pattern is applied to the scan chain immediately subsequently to the first chain test pattern being applied. Specifically, when it is determined that the second unloaded data pattern (the SO signal) passes the corresponding scan test for the first time (i.e., the first unloaded data pattern and all previous unloaded data patterns have failed), the grouped stage bypassed by the second chain test pattern is determined as having the defect.

In the above example where the grouped stage $B_3B_4$ have a defect, the SO signals generated based on the first chain test pattern (no grouped stage being bypassed), second chain test pattern (grouped stage $B_7B_8$ being bypassed), and third chain test pattern (grouped stage $B_5B_6$ being bypassed) fail the respective scan tests. However, when the next immediate chain test pattern, i.e., the fourth chain test pattern, is applied, the grouped stage $B_3B_4$ is bypassed. As a result, the corresponding SO signal passes the scan test. Thus, the defect may be determined as being present at the grouped stage $B_3B_4$.

Figure 6:
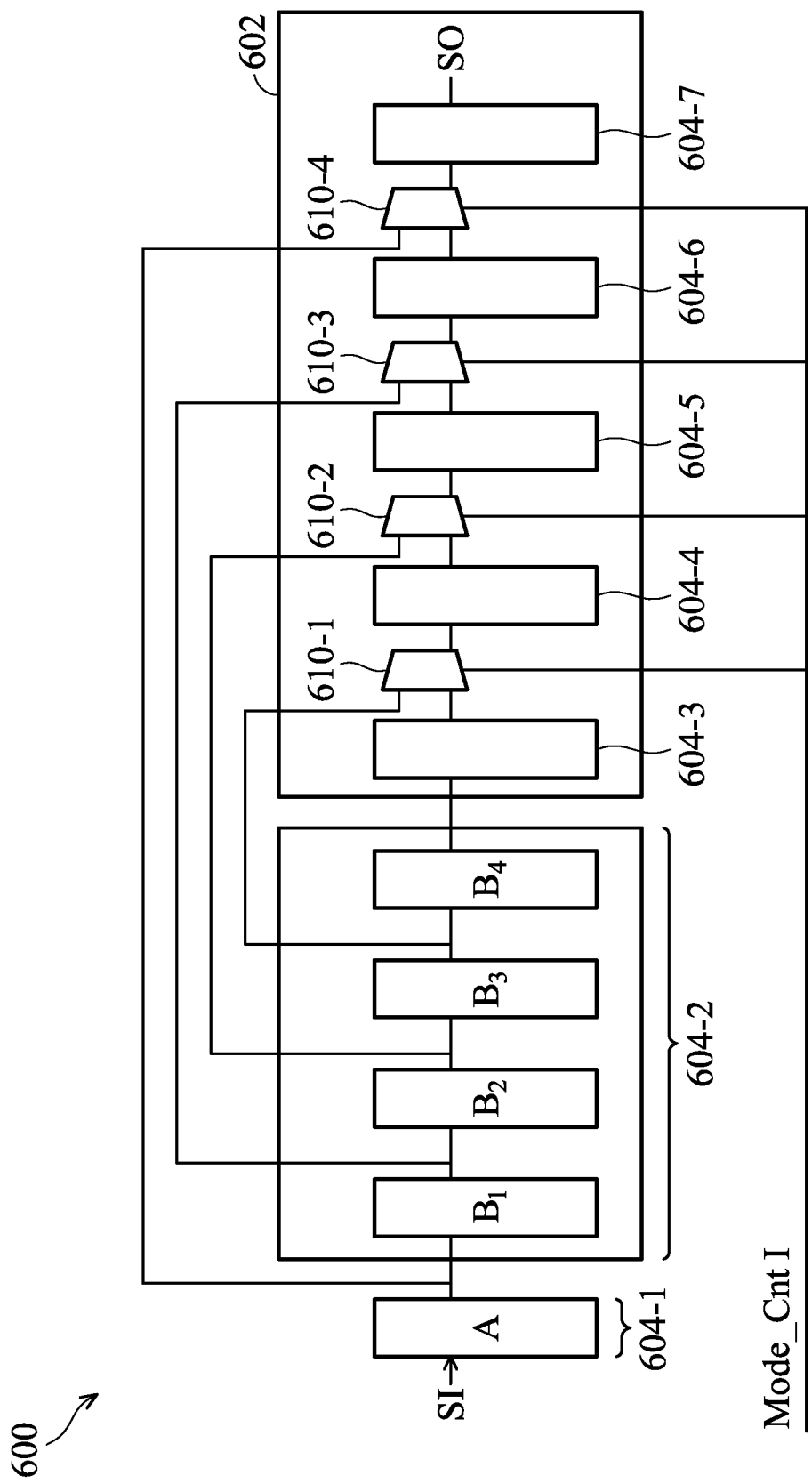
FIG. 6 illustrates a schematic diagram of another example scan chain, in accordance with some embodiments.

FIG. 6 illustrates a schematic diagram of an example scan chain 600, in accordance with various embodiments. The scan chain 600 can be an implementation of the scan chain 104 shown in FIG. 1. For example, the scan chain 600 can be operatively coupled to a to-be tested circuit, which is not shown in FIG. 6 for brevity purposes. In various embodiments of the present disclosure, the scan chain 600 includes at least one MB cell that includes a plural number of stages to store a plural number of data bits.

As shown, the scan chain 600 includes scan flip-flop circuits, 604-1 and 604-2 connected in series fashion. The scan chain 600 itself can be tested under a scan test mode in which a scan-in (SI) signal, received by the scan chain 600, is compared to a scan-out (SO) signal, generated by the scan chain 600. Such SI signal and SO signal are sometimes referred to as loaded data pattern and unloaded data pattern, respectively. In the illustrated example of FIG. 6, the scan flip-flop circuits 604-1 is a SB cell, while the scan flip-flop circuit 604-2 is a MB cell. Further in the example of FIG. 6, the multi-bit flip-flop circuit 604-2 includes multiple (cell) stages, that are indicated as "$B_1$," "$B_2$," "$B_3$," and "$B_4$," respectively. Each of the stages is configured to store one single data bit. For consistency, the single-bit flip-flop circuits 604-1 is indicated as stage "A."

In various embodiments, the scan chain 600 can further include a shadow scan chain 602 connected to the scan flip-flop circuits 604-1 and 604-2 in series. Stated another way, the original scan chain (consisting of the scan flip-flop circuits 604-1 and 604-2) and the newly added shadow scan chain 602 may be combined as one single scan chain, e.g., new scan chain 600. The shadow scan chain 602 is configured to observe (e.g., identify) a defect present at any of the stages of the multi-bit flip-flop circuit 604-2, which may include scan flip-flop circuits, 604-3, 604-4, 604-5, 604-6, and 604-7. Each of the scan flip-flop circuits (of the shadow scan chain) 604-3 to 604-7 may be a single-bit flip-flop circuit or SB cell. Specifically, the scan flip-flop circuits, 604-3, 604-4, 604-5, 604-6, and 604-7 are configured as shadow cells/stages for the stages $B_4$, $B_3$, $B_2$, $B_1$, and A, respectively.

In other words, the scan flip-flop circuit 604-3 can duplicate or otherwise copy a data bit stored in the stage $B_4$; the scan flip-flop circuit 604-4 can duplicate or otherwise copy a data bit stored in the stage $B_3$; the scan flip-flop circuit 604-5 can duplicate or otherwise copy a data bit stored in the stage $B_2$; the scan flip-flop circuit 604-6 can duplicate or otherwise copy a data bit stored in the stage $B_1$; and the scan flip-flop circuit 604-7 can duplicate or otherwise copy a data bit stored in the stage A. As such, the data bit stored in the stage $B_4$ of the multi-bit flip-flop circuit 604-2 is observable on the scan flip-flop circuit 604-3; the data bit stored in the stage $B_3$ of the multi-bit flip-flop circuit 604-2 is observable on the scan flip-flop circuit 604-4; the data bit stored in the stage $B_2$ of the multi-bit flip-flop circuit 604-2 is observable on the scan flip-flop circuit 604-5; the data bit stored in the stage $B_1$ of the multi-bit flip-flop circuit 604-2 is observable on the scan flip-flop circuit 604-6; and the data bit stored in the stage A (i.e., the single-bit flip-flop circuit 604-1) is observable on the scan flip-flop circuit 604-7. Accordingly, in FIG. 6 (and the following discussion), the flip-flop circuits, 604-3, 604-4, 604-5, 604-6, and 604-7 are indicated as stages "$SB_4$," "$SB_3$," "$SB_2$," "$SB_1$," and "SA," respectively.

In various embodiments, the scan chain 600 (or the shadow scan chain 602) can further include multiplexers, 610-1, 610-2, 610-3, and 610-4. The multiplexers 610-1 to 610-4 are each configured to selectively output a signal that is one of its received first or second input signal based on a common control signal (Mode_Cntl) received by all four multiplexers 610-1 to 610-4. The first input signal can be an output signal generated by a corresponding copied stage of the original scan chain, and the second input signal can be an output signal generated by a previous stage of the shadow scan chain 602. When the control signal (Mode_Cntl) is configured at logic 1, the multiplexer can select the first input signal as its output signal; and when the control signal (Mode_Cntl) is configured at logic 0, the multiplexer can select the second input signal as its output signal.

For example in FIG. 6, an output of the stage $B_3$ and an output of the previous copying stage $SB_4$ (scan flip-flop circuit 604-3) are connected to two inputs of the multiplexer 610-1, respectively. An output of the stage $B_2$ and an output of the previous copying stage $SB_3$ (scan flip-flop circuit 604-4) are connected to two inputs of the multiplexer 610-2, respectively. An output of the stage $B_1$ and an output of the previous copying stage $SB_2$ (scan flip-flop circuit 604-5) are connected to two inputs of the multiplexer 610-3, respectively. An output of the stage A and an output of the previous copying stage $SB_1$ (scan flip-flop circuit 604-6) are connected to two inputs of the multiplexer 610-4, respectively.

Referring to FIG. 7, depicted is an example table 700 with multiple rows to illustrate data patterns loaded into (an SI signal) or unloaded from (an SO signal) the scan chain 600. In the example of FIG. 7, the stage $B_1$ has a stuck-at-1 defect. The term "stuck-at-1" refers to a defect present in a flip-flop or cell stage, in which the cell stage can only output a logic 1, regardless of the input logic state received. The table of FIG. 7 is merely provided as a representative example. Thus, it should be noted that the disclosed methods and structures allow any of various other defects (e.g., stuck-at-0, transition defects, etc.) to be detected on a scan chain, while remaining within the scope of the present disclosure.

As shown, the SI signal (00000000000) is loaded to the scan chain 600. Assuming there were no defect in any of the stages $AB_1B_2B_3B_4SB_4SB_3SB_2SB_1SA$, the SO signal unloaded by the scan chain 600 should also present (00000000000). However, since the stage $B_1$ has a stuck-at-1 defect, this may not be the case. For example in row 501 (with Mode_Cntl set at logic 0), the SI signal (00000000000) is loaded into the scan chain 600. As the stage $B_1$ has a stuck-at-1 defect, every stage after the stage $B_1$ shows a logic 1. Consequently, in row 503 (with Mode_Cntl set at logic 0), the SO signal unloaded from the scan chain shows (11111111111), which means that the scan chain 600 fails the scan test but which of the stages has the defect cannot be determined yet.

Next, the control signal Mode_Cntl may be set at logic 1 to identify which of the stages has the defect. In some embodiments, when the control signal Mode_Cntl is set at logic 1, each of the multiplexers 610-1 to 610-4 is configured to select the input signal received directly from the corresponding stage inside the multi-bit flip-flip circuit 604-2 as its output signal, which allows the data bit stored by the stage A (of the single-bit flip-flop circuit 604-1) and the stages $B_1$, $B_2$, $B_3$, and $B_4$ (of the multi-bit flip-flip circuit 604-2) to be copied to the stages SA, $SB_1$, $SB_2$, $SB_3$, and $SB_4$, respectively.

For example in FIG. 7, during load cycle 1 of the SI signal, the data bits stored in the stage A and stage $B_1$ are copied to stages SA and $SB_1$, respectively, as indicated by arrows 505 and 507. During load cycle 2 of the SI signal, the data bits stored in the stage $B_2$ is copied to the stage $SB_2$, as indicated by arrow 509. During load cycle 3 of the SI signal, the data bits stored in the stage $B_3$ is copied to the stage $SB_3$, as indicated by arrow 511. During load cycle 4 of the SI signal, the data bits stored in the stage $B_4$ is copied to the stage $SB_4$, as indicated by arrow 513. Following loading all bits into the stages A to $B_4$ (e.g., 5 load cycles), the data bits stored by the scan chain 600 (including the shadow scan chain 602) are unloaded as the SO signal, as indicated by row 515.

In some embodiments, a first failing bit (when counted reversely to the direction of loading the SI signal, i.e., from the right to left) that is inconsistent with the SI signal can be utilized to determine a location of the defect present in the multi-bit flip-flip circuit 604-2. More specifically, the defect may be determined as being present at a copied stage (of the multi-bit flip-flip circuit 604-2), with its corresponding copying stage of the shadow scan chain that presents the first failing bit. In the example of FIG. 7, the first failing bit is presented by the stage $SB_1$ that copies the data bit of the stage $B_1$. Thus, it can be determined that the defect is present at the stage $B_1$ inside the multi-bit flip-flip circuit 604-2.

Figure 8:
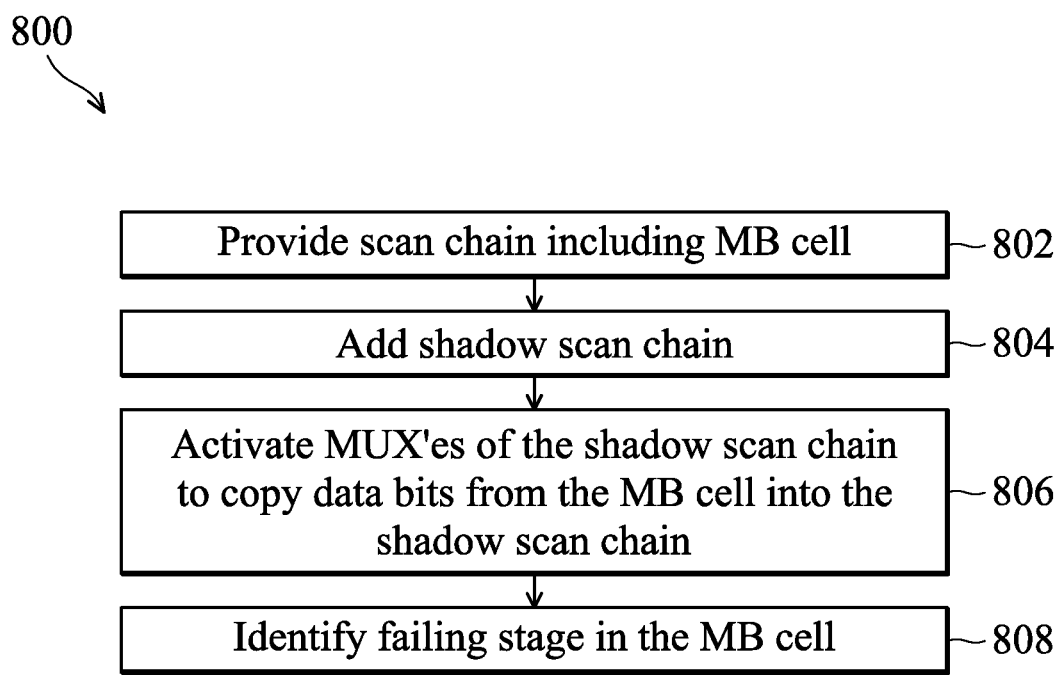
FIG. 8 illustrates a flow chart of an example method for testing the scan chain of FIG. 6, in accordance with some embodiments.

FIG. 8 illustrates a flow chart of an example method 800 for testing a scan chain that includes at least one MB cell, in accordance with various embodiments. The method 800 may be utilized to test the scan chain 600 of FIG. 6, and thus, discussion of the operations of the method 800 may be referred to one or more components discussed above in FIGS. 6-7. It is noted that the method 800 is merely an example and is not intended to limit the present disclosure. Accordingly, it is understood that additional operations may be provided before, during, and after the method 800 of FIG. 8, and that some other operations may only be briefly described herein.

The method 800 starts with operation 802 in which a scan chain including at least one MB cell is provided, in accordance with some embodiments of the present disclosure. Using the scan chain 600 as a representative example, the scan chain 600 includes a plurality of flip-flop circuits, 604-1 and 604-2, connected in series, in which the flip-flop circuit 604-1 is a SB cell (a single-bit flip-flop) that includes a single stage, e.g., stage A, and the flip-flop circuit 604-2 is a MB cell (a multi-bit flip-flop) that includes a plural number of stages, e.g., stages $B_1$, $B_2$, $B_3$, and $B_4$.

The method 800 proceeds to operation 804 in which a shadow scan chain is added to the original scan chain, in accordance with some embodiments of the present disclosure. Upon identifying the original scan chain having at least on MB cell, the shadow scan chain is added (e.g., connected) to the original scan chain. In some embodiments, the shadow scan chain can have a number of SB cells corresponding to a number of stages of the original scan chain. Continuing with the above example, the shadow scan chain 602, which includes flip-flop circuits 604-3 to 604-7, is connected to the stage $B_4$ of the original scan chain. The shadow scan chain also includes multiplexers 610-1 to 610-4 that are configured to copy the data bits stored by the stages $B_3$, $B_2$, $B_1$, and A to the flip-flop circuits 604-4, 604-5, 604-6, and 604-7, respectively, when activated. The flip-flop circuits 604-3, 604-4, 604-5, 604-6, and 604-7 are thus referred to as stages $SB_4$, $SB_3$, $SB_2$, $SB_1$, and SA, respectively.

The method 800 proceeds to operation 806 in which the multiplexers of the shadow scan chain are activated, in accordance with some embodiments of the present disclosure. Still with the same example, the multiplexers 610-1 to 610-4 are activated to copy the data bits stored by the stages $B_3$, $B_2$, $B_1$, and A to the stages $SB_3$, $SB_2$, $SB_1$, and SA, respectively. For instance, during a first load cycle of the SI signal, the data stored by the stage A can be copied to the stage SA, as long as the multiplexer 610-4 is activated; during a second load cycle of the SI signal, the data stored by the stage $B_1$ can be copied to the stage $SB_1$, as long as the multiplexer 610-3 is activated; during a third load cycle of the SI signal, the data stored by the stage $B_2$ can be copied to the stage $SB_2$, as long as the multiplexer 610-2 is activated; and during a fourth load cycle of the SI signal, the data stored by the stage $B_3$ can be copied to the stage $SB_3$, as long as the multiplexer 610-1 is activated. Moreover, since the stage $SB_4$ is connected directly to the stage $B_4$, the data bit stored in the stage $B_4$ can be copied to the stage $SB_4$.

The method 800 proceeds to operation 808 in which a failing stage inside the MB cell can be identified, in accordance with some embodiments of the present disclosure.

Referring to the same example above, after the SI signal has been loaded into all the stages inside the MB cell, data bits stored by the scan chain 600 (together with the shadow scan chain 602) can unloaded as the SO signal. In some embodiments, when a defect is present at any of the stages inside the MB cell, the defect may be identified according to its corresponding copying stage of the shadow scan chain that presents a first failing bit on the SO signal. For example in FIG. 7, the first failing bit is presented by the stage $SB_1$ that copies the data bit of the stage $B_1$. Thus, it can be determined that the defect is present at the stage $B_1$ inside the MB cell 604-2.

Figure 9:
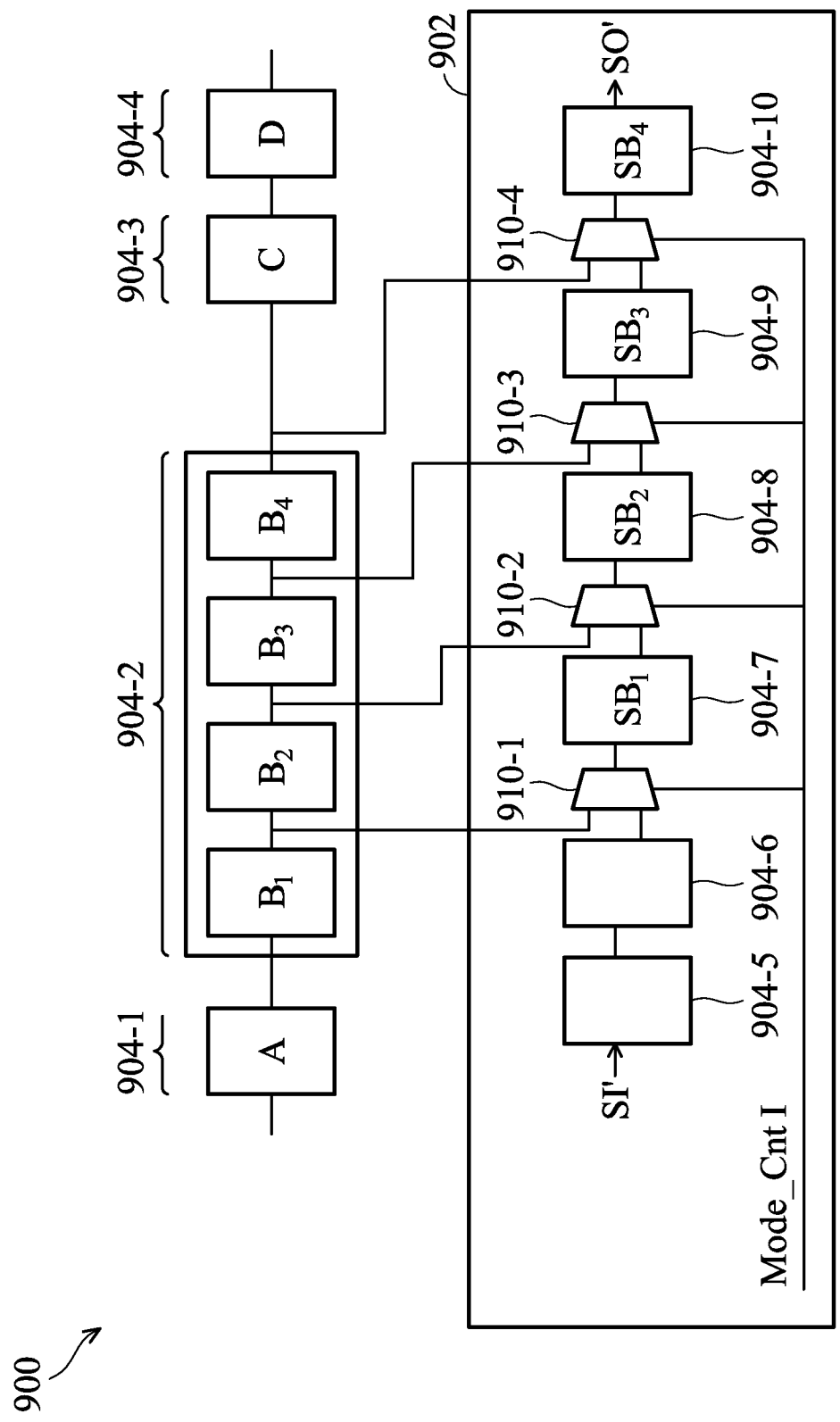
FIG. 9 illustrates a schematic diagram of yet another example scan chain, in accordance with some embodiments.

FIG. 9 illustrates a schematic diagram of an example scan chain 900, in accordance with various embodiments. The scan chain 900 can be an implementation of the scan chain 104 shown in FIG. 1. For example, the scan chain 900 can be operatively coupled to a to-be tested circuit, which is not shown in FIG. 9 for brevity purposes. In various embodiments of the present disclosure, the scan chain 900 includes at least one MB cell that includes a plural number of stages to store a plural number of data bits.

As shown, the scan chain 900 includes scan flip-flop circuits, 904-1, 904-2, 904-3, and 904-4 connected in series fashion. In the illustrated example of FIG. 9, the scan flip-flop circuits 904-1, 904-3, and 904-4 are each a SB cell, while the scan flip-flop circuit 904-2 is a MB cell. Further in the example of FIG. 9, the multi-bit flip-flop circuit 904-2 includes multiple (cell) stages, that are indicated as "$B_1$," "$B_2$," "$B_3$," and "$B_4$," respectively. Each of the stages is configured to store one single data bit. For consistency, the single-bit flip-flop circuits 904-1, 904-3, and 904-4 are indicated as stages "A," "C," and "D," respectively.

In various embodiments, the scan chain 900 can further include a shadow scan chain 902 to couple to the original scan chain consisting of the scan flip-flop circuits 904-1 to 904-4. The original scan chain (consisting of the scan flip-flop circuits 904-1 to 904-4) and the shadow scan chain 902, while having their respective scan-in signals and scan-out signals, may be coupled to each other as new scan chain 900. Stated another way, the original scan chain and the shadow scan chain are two separate scan chains. The shadow scan chain 902 is configured to observe (e.g., identify) a defect present at any of the stages of the multi-bit flip-flop circuit 904-2, which may include scan flip-flop circuits, 904-5, 904-6, 904-7, 904-8, 904-9, and 904-10. Each of the scan flip-flop circuits (of the shadow scan chain) 904-5 to 904-10 may be a single-bit flip-flop circuit or SB cell. Specifically, the scan flip-flop circuits, 904-7, 904-8, 904-9, and 904-10 are configured as shadow cells/stages for the stages $B_1$, $B_2$, $B_3$, and $B_4$, respectively.

In other words, the scan flip-flop circuit 904-7 can duplicate or otherwise copy a data bit stored in the stage $B_1$; the scan flip-flop circuit 904-8 can duplicate or otherwise copy a data bit stored in the stage $B_2$; the scan flip-flop circuit 904-9 can duplicate or otherwise copy a data bit stored in the stage $B_3$; and the scan flip-flop circuit 904-10 can duplicate or otherwise copy a data bit stored in the stage $B_4$. Accordingly, in FIG. 9 (and the following discussion), the flip-flop circuits, 904-7, 904-8, 904-9, and 904-10 are indicated as stages "$SB_1$," "$SB_2$," "$SB_3$," and "$SB_4$," respectively.

In various embodiments, the scan chain 900 (or the shadow scan chain 902) can further include multiplexers, 910-1, 910-2, 910-3, and 910-4. The multiplexers 910-1 to 910-4 are each configured to selectively output a signal that is one of its received first or second input signal based on a common control signal (Mode_Cntl) received by all four multiplexers 910-1 to 910-4. The first input signal can be an output signal generated by a corresponding copied stage inside the multi-bit flip-flop circuit 904-2, and the second input signal can be an output signal generated by a previous stage of the shadow scan chain 902. When the control signal (Mode_Cntl) is configured at logic 1, the multiplexer can select the first input signal as its output signal; and when the control signal (Mode_Cntl) is configured at logic 0, the multiplexer can select the second input signal as its output signal.

For example in FIG. 9, an output of the stage $B_1$ and an output of the previous stage (scan flip-flop circuit 904-6) are connected to two inputs of the multiplexer 910-1, respectively. An output of the stage $B_2$ and an output of the previous stage $SB_1$ (scan flip-flop circuit 904-7) are connected to two inputs of the multiplexer 910-2, respectively. An output of the stage $B_3$ and an output of the previous stage $SB_2$ (scan flip-flop circuit 904-8) are connected to two inputs of the multiplexer 910-3, respectively. An output of the stage $B_4$ and an output of the previous stage $SB_3$ (scan flip-flop circuit 904-9) are connected to two inputs of the multiplexer 910-4, respectively.

In such a configuration, a defect present in the MB cell (multi-bit flip-flop circuit 904-2) can be pinpointed by identifying a failing bit presented on the scan-out signal (SO') unloaded from the shadow scan chain 902. For example, when identifying a failing bit on the SO' signal, a copied stage inside the MB cell that corresponds to the copying stage (e.g., $SB_1$, $SB_2$, $SB_3$, and/or $SB_4$) presenting the failing bit can be determined as the failing bit inside the MB cell.

Figure 10:
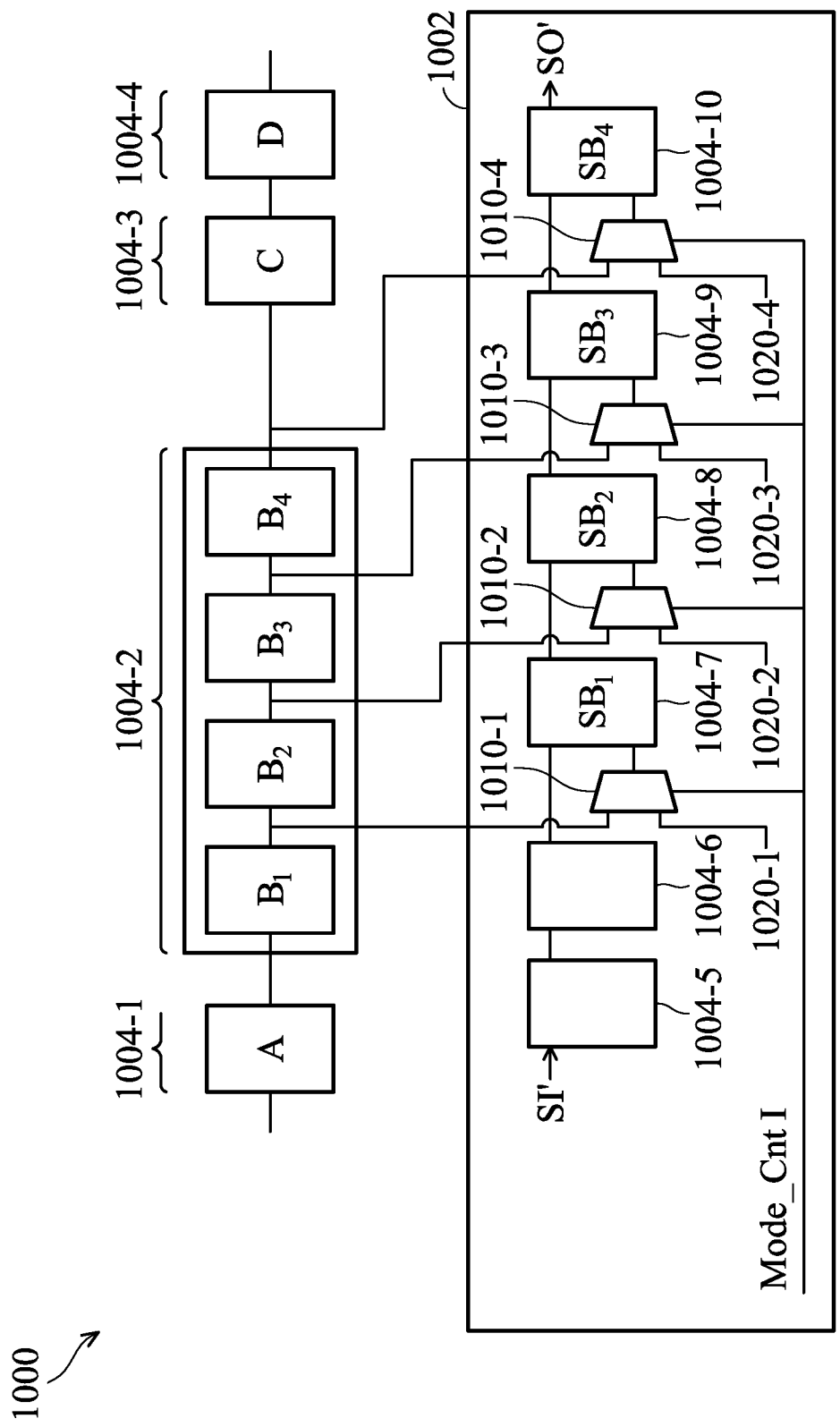
FIG. 10 illustrates a schematic diagram of yet another example scan chain, in accordance with some embodiments.

FIG. 10 illustrates a schematic diagram of an example scan chain 1000, in accordance with various embodiments. The scan chain 1000 can be an implementation of the scan chain 104 shown in FIG. 1. For example, the scan chain 1000 can be operatively coupled to a to-be tested circuit, which is not shown in FIG. 10 for brevity purposes. In various embodiments of the present disclosure, the scan chain 1000 includes at least one MB cell that includes a plural number of stages to store a plural number of data bits.

As shown, the scan chain 1000 includes scan flip-flop circuits, 1004-1, 1004-2, 1004-3, and 1004-4 connected in series fashion. In the illustrated example of FIG. 10, the scan flip-flop circuits 1004-1, 1004-3, and 1004-4 are each a SB cell, while the scan flip-flop circuit 1004-2 is a MB cell. Further in the example of FIG. 10, the multi-bit flip-flop circuit 1004-2 includes multiple (cell) stages, that are indicated as "$B_1$," "$B_2$," "$B_3$," and "$B_4$," respectively. Each of the stages is configured to store one single data bit. For consistency, the single-bit flip-flop circuits 1004-1, 1004-3, and 1004-4 are indicated as stages "A," "C," and "D," respectively.

In various embodiments, the scan chain 1000 can further include a shadow scan chain 1002 to couple to the original scan chain consisting of the scan flip-flop circuits 1004-1 to 1004-4. The original scan chain (consisting of the scan flip-flop circuits 1004-1 to 1004-4) and the newly added shadow scan chain 1002, while having their respective scan-in signals and scan-out signals, may be coupled to each other as new scan chain 1000. Stated another way, the original scan chain and the shadow scan chain are two separate scan chains. The shadow scan chain 1002 is configured to observe (e.g., identify) a defect present at any of the stages of the multi-bit flip-flop circuit 1004-2, which may include scan flip-flop circuits, 1004-5, 1004-6, 1004-7, 1004-8, 1004-9, and 1004-10. Each of the scan flip-flop circuits (of the shadow scan chain) 1004-5 to 1004-10 may be a single-bit flip-flop circuit or SB cell. Specifically, the scan flip-flop circuits, 1004-7, 1004-8, 1004-9, and 1004-10 are configured as shadow cells/stages for the stages $B_1$, $B_2$, $B_3$, and $B_4$, respectively.

In other words, the scan flip-flop circuit 1004-7 can duplicate or otherwise copy a data bit stored in the stage $B_1$; the scan flip-flop circuit 1004-8 can duplicate or otherwise copy a data bit stored in the stage $B_2$; the scan flip-flop circuit 1004-9 can duplicate or otherwise copy a data bit stored in the stage $B_3$; and the scan flip-flop circuit 1004-10 can duplicate or otherwise copy a data bit stored in the stage $B_4$. Accordingly, in FIG. 10 (and the following discussion), the flip-flop circuits, 1004-7, 1004-8, 1004-9, and 1004-10 are indicated as stages "$SB_1$," "$SB_2$," "$SB_3$," and "$SB_4$," respectively.

In various embodiments, the scan chain 1000 (or the shadow scan chain 1002) can further include multiplexers, 1010-1, 1010-2, 1010-3, and 1010-4. The multiplexers 1010-1 to 1010-4 are each configured to selectively output a signal that is one of its received first or second input signal based on a common control signal (Mode_Cntl) received by all four multiplexers 1010-1 to 1010-4. The first input signal can be an output signal generated by a corresponding copied stage inside the multi-bit flip-flop circuit 1004-2, and the second input signal can be a signal captured from a corresponding functional circuit (or logic). When the control signal (Mode_Cntl) is configured at logic 1, the multiplexer can select the first input signal as its output signal; and when the control signal (Mode_Cntl) is configured at logic 0, the multiplexer can select the second input signal as its output signal.

For example in FIG. 10, an output of the stage $B_1$ and an output of corresponding functional circuit 1020-1 are connected to two inputs of the multiplexer 1010-1, respectively. The multiplexer 1010-1 has an output connected to a data input (D) of the stage $SB_1$. An output of the stage $B_2$ and an output of corresponding functional circuit 1020-2 are connected to two inputs of the multiplexer 1010-2, respectively. The multiplexer 1010-2 has an output connected to a data input (D) of the stage $SB_2$. An output of the stage $B_3$ and an output of corresponding functional circuit 1020-3 are connected to two inputs of the multiplexer 1010-3, respectively. The multiplexer 1010-3 has an output connected to a data input (D) of the stage $SB_3$. An output of the stage $B_4$ and an output of the corresponding functional circuit 1020-4 are connected to two inputs of the multiplexer 1010-4, respectively. The multiplexer 1010-4 has an output connected to a data input (D) of the stage $SB_4$.

In such a configuration, a defect present in the MB cell (multi-bit flip-flop circuit 1004-2) can be pinpointed by identifying a failing bit presented on the scan-out signal (SO') unloaded from the shadow scan chain 1002. For example, when identifying a failing bit on the SO' signal, a copied stage inside the MB cell that corresponds to the copying stage (e.g., $SB_1$, $SB_2$, $SB_3$, and/or $SB_4$) presenting the failing bit can be determined as the failing bit inside the MB cell. Further, in some embodiments, when the control signal (Mode_Cntl) is configured at logic 1, bits from the MB cell can be copied to the shadow scan chain 1002.

Figure 11:
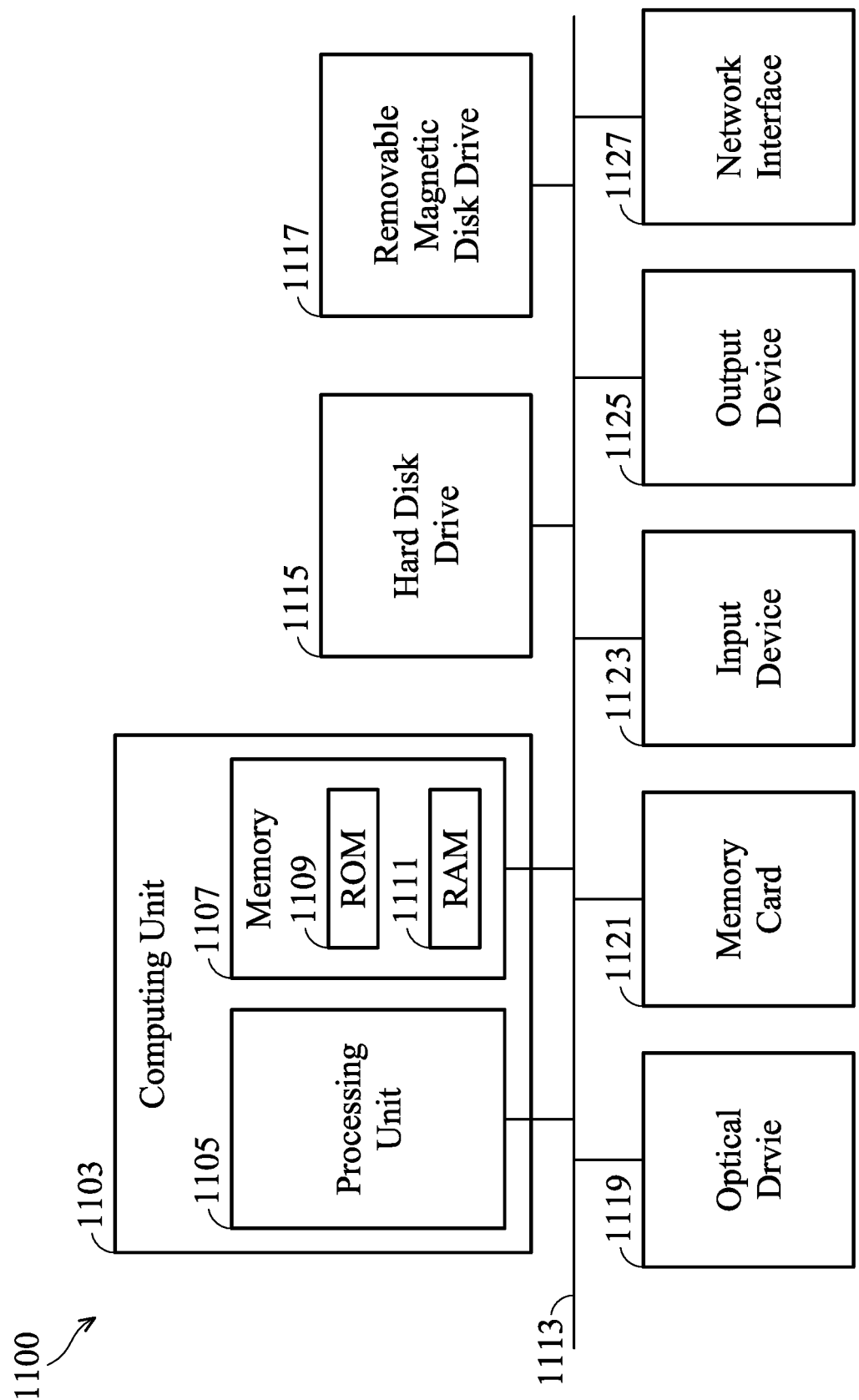
FIG. 11 illustrates a block diagram of an example computer system, in accordance with some embodiments.

Various examples of the disclosed techniques (e.g., method 500, method 800) may be implemented through the execution of software instructions by a computing device, such as a programmable computer. For example, the computing device may be caused to perform a method for creating test circuitry in a circuit design for testing a chip fabricated according to the circuit design. FIG. 11 illustrates an illustrative example of a computing device 1100. As shown, the computing device 1100 includes a computing unit 1103 with at least one processing unit (or processor) 1105 and a system memory 1107. The processing unit 1105 may be any type of programmable electronic device for executing software instructions. The system memory 1107 may include both a read-only memory (ROM) 1109 and a random access memory (RAM) 1111. As will be appreciated by those of ordinary skill in the art, both the read-only memory (ROM) 1109 and the random access memory (RAM) 1111 may store software instructions for execution by the processing unit 1105.

The processing unit 1105 and the system memory 1107 are connected, either directly or indirectly, through a bus 1113 or alternate communication structure, to one or more peripheral devices. For example, the processing unit 1105 or the system memory 1107 may be directly or indirectly connected to one or more additional memory storage devices, such as a "hard" magnetic disk drive 1115, a removable magnetic disk drive 1117, an optical disk drive 1119, or a flash memory card 1121. The processing unit 1105 and the system memory 1107 also may be directly or indirectly connected to one or more input devices 1123 and one or more output devices 1125. The input devices 1123 may include, for example, a keyboard, a pointing device (such as a mouse, touchpad, stylus, trackball, or joystick), a scanner, a camera, and a microphone. The output devices 1125 may include, for example, a monitor display, a printer and speakers. With various examples of the computing device 1100, one or more of the peripheral devices 1115-1125 may be internally housed with the computing unit 1103. Alternately, one or more of the peripheral devices 1115-1125 may be external to the housing for the computing unit 1103 and connected to the bus 1113 through, for example, a Universal Serial Bus (USB) connection.

With some implementations, the computing unit 1103 may be directly or indirectly connected to one or more network interfaces 1127 for communicating with other devices making up a network. The network interface 1127 translates data and control signals from the computing unit 1103 into network messages according to one or more communication protocols, such as the transmission control protocol (TCP) and the Internet protocol (IP). Also, the interface 1127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 1100 is illustrated as an example only, and it is not intended to be limiting. Various embodiments of the disclosed technology may be implemented using one or more computing devices that include the components of the computing device 1100 illustrated in FIG. 11, which include only a subset of the components illustrated in FIG. 11, or which include an alternate combination of components, including components that are not shown in FIG. 11. For example, various embodiments of the disclosed technology may be implemented using a multi-processor computer, a plurality of single and/or multiprocessor computers arranged into a network, or some combination of both.

In one aspect of the present disclosure, a circuit is disclosed. The circuit includes a scan chain comprising a cell structure, wherein the cell structure comprises a first plural number (N) of stages, and each of the stages is configured to store a bit. The circuit includes a second plural number (S) of multiplexers operatively coupled to the scan chain, wherein the S is determined as $$\frac{N}{M},$$

where the M represents a diagnostic resolution. The multiplexers are each configured to receive a respective one of S control signals to selectively bypass a corresponding subset of the stages.

In another aspect of the present disclosure, a circuit is disclosed. The circuit includes a scan chain comprising a cell structure, wherein the cell structure comprises a first plural number (N) of stages, and each of the stages is configured to store a bit. The circuit includes a second plural number (S) of multiplexers operatively coupled to the N stages, wherein the S is a factor of the N. The multiplexers are each configured to receive a respective one of control signals to selectively bypass a corresponding one of subsets of the stages.

In yet another aspect of the present disclosure, a method for testing a scan chain is disclosed. The method includes providing a scan chain comprising a cell structure, wherein the cell structure comprises a first plural number (N) of stages, and each of the stages is configured to store a bit. The method includes determining a diagnostic resolution (M). The method includes generating a second plural number (P) of chain test patterns, wherein each of the chain test patterns is configured to bypass one or more subsets of the stages. The method includes determining a defect location at any subset of the stages based at least on comparing a first unloaded data pattern and a second unloaded data pattern generated by a first one of the chain test patterns and a second one of the chain test patterns, respectively. The P is determined as S+1, in which the S is determined as $$\frac{N}{M}.$$

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
 a scan chain comprising a cell structure, wherein the cell structure comprises a first plural number (N) of stages, and each of the stages is configured to store a bit;
 a second plural number (S) of multiplexers operatively coupled to the scan chain, wherein the S is determined as $$\frac{N}{M},$$

where the MV represents a diagnostic resolution;
 wherein the multiplexers are each configured to receive a respective one of S control signals to selectively bypass a corresponding subset of the stages.

2. The circuit of claim 1, wherein the M is a plural number.

3. The circuit of claim 1, wherein a number of the subset of stages bypassed is equal to the M.

4. The circuit of claim 1, wherein a number of combinations of the S control signals is equal to S+1.

5. The circuit of claim 1, wherein a first one of the multiplexers has:
 a first input connected to an output of a second one of the multiplexers;
 a second input connected to an output of the corresponding subset of stages; and
 an output connected to a first input of a third one of the multiplexers.

6. The circuit of claim 5, wherein the second multiplexer, the first multiplexer, and the third multiplexer are connected in such an order along a direction from a scan input of the scan chain to a scan output of the scan chain.

7. The circuit of claim 6, wherein when the control signal received by the first multiplexer is at a first logic state, the first multiplexer is configured to couple the output of the corresponding subset of stages to the first input of the third multiplexer.

8. The circuit of claim 7, wherein when the control signal received by the first multiplexer is at a second logic state, the multiplexer is configured to couple the output of the second multiplexer to the first input of the third multiplexer.

9. The circuit of claim 8, wherein the corresponding subset of stages are thus bypassed.

10. The circuit of claim 1, wherein a defect location at any of the subsets of the stages is determined based at least on comparing a first data pattern and a second data pattern, wherein the first data pattern and the second data pattern are unloaded by the scan chain based on a first combination of the control signals and a second combination of the control signals, respectively.

11. The circuit of claim 10, wherein the first combination of the control signals and the second combination of the control signals are different from each other with only one bit.

12. A circuit, comprising:
 a scan chain comprising a cell structure, wherein the cell structure comprises a first plural number (N) of stages, and each of the stages is configured to store a bit;
 a second plural number (S) of multiplexers operatively coupled to the N stages, wherein the S is a factor of the N,
 wherein the multiplexers are each configured to receive a respective one of control signals to selectively bypass a corresponding one of subsets of the stages.

13. The circuit of claim 12, wherein the S is determined as $$\frac{N}{M},$$

where the M represents a diagnostic resolution.

14. The circuit of claim 12, wherein a first one, a second one, and a third one of the multiplexers are connected in such an order along a direction from a scan input of the scan chain to a scan output of the scan chain.

15. The circuit of claim 14, wherein each of the multiplexers has:
- a first input;
- a second input; and
- an output;
- wherein the first input of the first multiplexer is coupled to the scan input, the second input of the first multiplexer is connected to an output of a first subset of the stages, and the output of the first multiplexer is connected to the first input of the second multiplexer;
- wherein the second input of the second multiplexer is connected to an output of a second subset of the stages, and the output of the second multiplexer is connected to the first input of the third multiplexer; and
- wherein the second input of the third multiplexer is connected to an output of a third subset of the stages, and the output of the third multiplexer is coupled to the scan output.

16. The circuit of claim 12, wherein a number of combinations of the control signals received by the multiplexers is equal to S+1.

17. The circuit of claim 12, a defect location at any of the subsets of the stages is determined based at least on comparing a first data pattern and a second data pattern, wherein the first data pattern and the second data pattern are unloaded by the scan chain based on a first combination of the control signals and a second combination of the control signals, respectively.

18. The circuit of claim 17, wherein the first combination of the control signals and the second combination of the control signals are different from each other with only one bit.

19. A method for testing a scan chain, comprising:
- providing a scan chain comprising a cell structure, wherein the cell structure comprises a first plural number (N) of stages, and each of the stages is configured to store a bit;
- determining a diagnostic resolution (M);
- generating a second plural number (P) of chain test patterns, wherein each of the chain test patterns is configured to bypass one or more subsets of the stages; and
- determining a defect location at any subset of the stages based at least on comparing a first unloaded data pattern and a second unloaded data pattern generated by a first one of the chain test patterns and a second one of the chain test patterns, respectively;
- wherein the P is determined as S+1, in which the S is determined as $$\frac{N}{M}.$$

20. The method of claim 19, wherein the first chain test patterns and the second chain test patterns are different from each other with only one bit.

* * * * *